(12) United States Patent
Yu et al.

(10) Patent No.: US 6,501,137 B1
(45) Date of Patent: Dec. 31, 2002

(54) ELECTROSTATIC DISCHARGE PROTECTION CIRCUIT TRIGGERED BY PNP BIPOLAR ACTION

(75) Inventors: Ta-Lee Yu, Hsinchu Hsien (TW); Shyh-Chyi Wong, Taichung (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/633,492

(22) Filed: Aug. 7, 2000

Related U.S. Application Data

(63) Continuation-in-part of application No. 09/223,652, filed on Dec. 30, 1998, now Pat. No. 6,147,369.

(30) Foreign Application Priority Data

Oct. 14, 1999 (TW) .......................................... 88117758

(51) Int. Cl.⁷ .......................... H01L 29/74; H01L 23/62
(52) U.S. Cl. ...................... 257/355; 257/361; 257/362; 257/355; 257/356; 257/173; 257/133; 257/124; 257/126; 361/91.1; 361/100
(58) Field of Search ................................. 257/355, 361, 257/362, 173, 124, 126, 133, 356, 546; 361/91.1, 100

(56) References Cited

U.S. PATENT DOCUMENTS

| | | | |
|---|---|---|---|
| 5,012,317 A | | 4/1991 | Rountre |
| 5,465,189 A | | 11/1995 | Polgreen et al. |
| 5,602,404 A | * | 2/1997 | Chen et al. ............... 257/112 |
| 5,615,073 A | * | 3/1997 | Fried et al. ............... 361/56 |
| 5,814,865 A | * | 9/1998 | Duvvury et al. .......... 257/360 |
| 5,898,205 A | * | 4/1999 | Lee ........................... 257/355 |
| 5,905,288 A | * | 5/1999 | Ker ........................... 257/355 |
| 6,081,002 A | * | 6/2000 | Amerasekera et al. .... 257/173 |
| 6,147,369 A | * | 11/2000 | Chen et al. ............... 257/173 |
| 6,172,403 B1 | * | 1/2001 | Chen ......................... 257/355 |

* cited by examiner

Primary Examiner—Eddie Lee
Assistant Examiner—Joseph Nguyen
(74) Attorney, Agent, or Firm—Ladas & Parry

(57) ABSTRACT

An electrostatic discharge protection circuit, comprising a semiconductor-controlled rectifier and a PMOS device. The semiconductor-controlled rectifier, coupled between two nodes, has an N-type semiconductor layer. The PMOS device, integrated with the semiconductor-controlled rectifier to share a first P-type doped region, has a PNP device located in the N-type semiconductor layer. When one of the nodes is coupled to the electrostatic discharge power, the PNP device will conduct to trigger the semiconductor-controlled rectifier.

13 Claims, 3 Drawing Sheets

ELECTROSTATIC DISCHARGE PROTECTION CIRCUIT TRIGGERED BY PNP BIPOLAR ACTION

The present application is a continuation-in-part of U.S. application Ser. No. 09/223,652, filed Dec. 30, 1998, now U.S. Pat. No. 6,147,369.

FIELD OF THE INVENTION

The present invention relates to a semiconductor integrated circuit technique. More particularly, it relates to an electrostatic discharge protection circuit applied to a semiconductor integrated circuit, which is triggered to conduct through PNP bipolar action.

DESCRIPTION OF THE PRIOR ART

In the processes of measuring, assembling, installing and using an integrated circuit, Electrostatic Discharge (ESD) is unavoidable and may cause damage to integrated circuits. At present, there are many models explaining the causes of ESD, wherein the human body model is most common. The human body model refers to the ESD pulse caused by a human body's contact with the pins of an integrated circuit. Since the ESD pulse of the human body model lasts longest, the makers use this as a standard for integrated circuit ESD protection.

With the adoption of the Lightly Doped Drain (LDD) structure and the self-aligned mental salicide diffusion production process, the Lateral Semiconductor Controlled Rectifier has been applied as an ESD protection circuit in CMOS integrated circuits, as disclosed in U.S. Pat. No. 5,012,317. The Lateral Semiconductor Controlled Rectifier, disclosed in U.S. Pat. No. 5,012,317, is triggered by a P/N junction breakdown between the well region and the base. However, in practical applications, the trigger voltage is above 30V. For sub-micron or half-micron COMS devices, the gate oxide is damaged by this trigger voltage. Therefore, the Lateral Semiconductor Controlled Rectifier of the prior art doesn't provide effective ESD protection.

To reduce the trigger voltage, U.S. Pat. No. 5,465,189 provides a semiconductor controlled rectifier triggered by a low voltage. It uses a device similar to NMOS to provide a thickly doped region across the junction between the well region and the base. When the ESD occurs, the junction breakdown of the thickly doped region of the device causes the semiconductor controlled rectifier to be triggered to conduct; thereby, the trigger voltage of the ESD protection circuit is reduced. However, if the diffusion production process of the self-aligned mental salicide is applied to the source or drain of the device, the effect of ESD protection will be reduced.

SUMMARY OF THE INVENTION

It is an object of the invention to provide an ESD protection circuit for semiconductor integrated circuits, which triggers the semiconductor controlled rectifier by using the PMOS device through PNP bipolar action. According to the invention, the ESD protection circuit offers the advantages of ESD protection and compatibility with the self-aligned mental salicide diffusion production process.

To achieve the above-mentioned object, the present invention provides an ESD protection circuit. The ESD protection circuit comprises a semiconductor controlled rectifier and a PMOS device. The semiconductor controlled rectifier coupled between two nodes has an N-type semiconductor layer. The PMOS device shares a first P-type doped region with the semiconductor controlled rectifier and comprises a PNP device located in the N-type semiconductor layer. When one of the nodes is coupled to the ESD power, the PNP device will conduct to trigger the semiconductor controlled rectifier.

Therefore, since the semiconductor controlled rectifier conduction is triggered to conduct through the PNP bipolar action, the ESD protection circuit has the advantages of ESD protection and compatibility with the self-aligned mental salicide diffusion production process.

BRIEF DESCRIPTION OF THE DRAWINGS

The present invention can be more fully understood from the following detailed description and preferred embodiments with reference to the accompanying drawings in which.

DETAILED DESCRIPTION OF THE PREFERRED EMBODIMENT

According to the invention, an ESD protection circuit for semiconductor integrated circuits is provided, which uses a PMOS device to trigger the semiconductor controlled rectifier through PNP bipolar action. In other words, by using the characteristics of PMOS devices, the ESD protection circuit has the advantages of ESD protection and compatibility with the self-aligned mental salicide diffusion production process.

The ESD protection circuit according to the invention is compatible with the CMOS production process; that is, the techniques such as N-type well region/P-type base, P-type well region/N-type base, or twin-well region can be adopted. All the following embodiments take N-type well region/P-type base as an example, but this is not intended to limit the scope of the invention, and those persons skilled in the art should know that the ESP protection circuit is also applied to P-type well region/N-type base, or twin-well region.

First Embodiment

Figure 1:
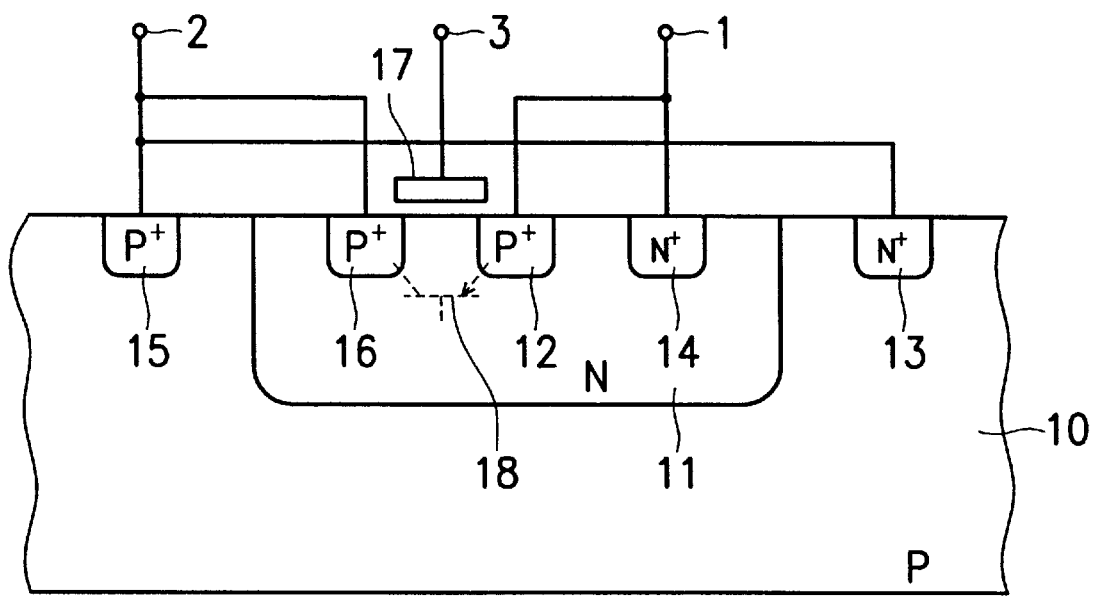
FIG. 1 is a cross section of a first preferred embodiment of the ESD protection circuit according to the invention.

Refer to FIG. 1, which shows a cross section of a first preferred embodiment of the ESD protection circuit according to the invention, wherein the reference number 10 represents a P-type semiconductor base 10. An N-type well region 11 is located in a predetermined location in the P-type semiconductor base. A P$^+$-type doped region 12 is located in the N-type well region 11, and an N$^+$-type doped region 13 is located in the P-type semiconductor base 10.

Further, the N$^+$-type doped region 14 and the P$^+$-type doped region 12 are located separated from each other in the N-type well region to be the ohmic contact region of the N-type well region 11. A P$^+$-type doped region 15 located in the P-type semiconductor base 10 is the ohmic contact region of the P-type semiconductor base 10. The N$^+$-type doped region 13 and the P$^+$-type doped region 15 can be located on the same side of the N-type well region 11, or separately on both sides of the N-type well region 11 as shown in FIG. 1.

As shown in FIG. 1, the P$^+$-type doped region 12 and the N$^+$-type doped region 14 are coupled to be a node 1, and the N$^+$-type doped region 13 and the P$^+$-type doped region 15 are coupled to be a node 2. The nodes 1 and 2 can be respectively coupled to a junction pad (input junction pad, output junction pad, input/output junction pad) and the V$_{SS}$ power rail, respectively coupled to the V$_{DD}$ power rail and a junction pad, or respectively coupled to the V$_{DD}$ power rail and the V$_{SS}$ power rail.

Further, a P$^+$-type doped region 16 is located in the N-type well region 11 separated from the P$^+$-type doped region 12 and coupled to the node 2. Specifically, the P$^+$-type doped region 16, the P$^+$-type doped region 12, and a part of the N-type well region 11 in between construct a PNP transistor 18. Preferably, the P$^+$-type doped region 16 and the N$^+$-type doped region 14 are separately located on both sides of the P$^+$-type doped region 12, as shown in FIG. 1. Further, between the P$^+$-type doped region 16 and the P$^+$-type doped region 12 a gate 17 is located, and the gate 17 is coupled to a node 3 which can be coupled to the V$_{DD}$ power rail.

Figure 2:
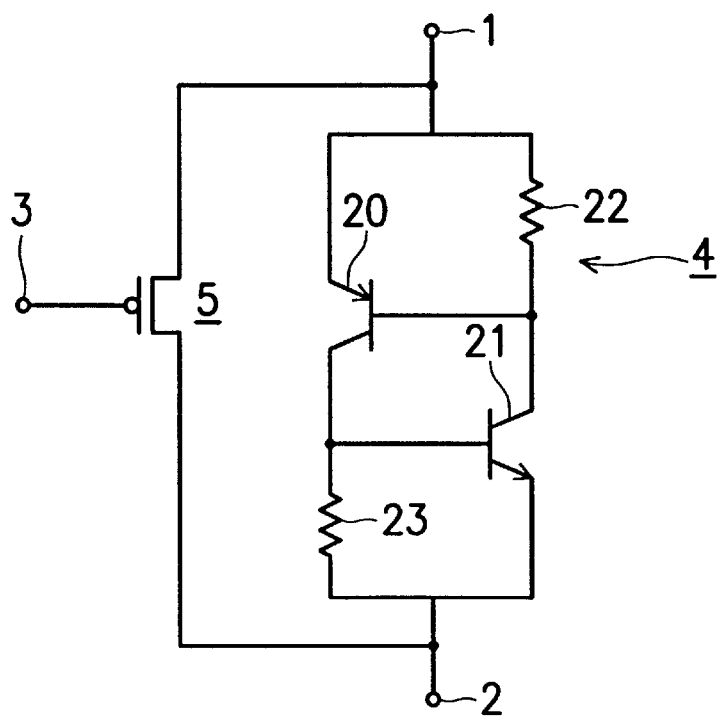
FIG. 2 is an equivalent circuit diagram of FIG. 1.

Therefore, the P$^+$-type doped region 12, the N-type well region 11 and the P-type semiconductor base 10 respectively construct the emitter, the base, and the collector of a PNP bipolar junction transistor 20. The N-type well region 11, the P-type semiconductor base 10, and the N$^+$-type doped region 13 respectively construct the collector, the base, and the emitter of an NPN bipolar junction transistor 21. In other words, the P$^+$-type doped region 12, the N-type well region 11, the P-type semiconductor base 10, and the N$^+$-type doped region 13 construct a semiconductor controlled rectifier 4; the P$^+$-type doped region 12 and the N$^+$-type doped region 13 are respectively the anode and the cathode of the semiconductor controlled rectifier 4. FIG. 2 is an equivalent circuit diagram of FIG. 1, wherein the resistors 22 and 23 respectively represent the spreading resistance of the N-type well region 11 and the P-type semiconductor base 10.

Further, the PMOS device 5 shown in FIG. 2 is constructed by the gate 17, the P$^+$-type doped region 16, and the P$^+$-type doped region 12, so the P$^+$-type doped regions 16 and 12 are the source/drain pair of the PMOS device 5. In other words, the P$^+$-type doped region 12 is a common region of the semiconductor controlled rectifier 4 and the PMOS device 5.

When ESD stress occurs at the node 1, the PMOS device 5 will breakdown and further trigger the semiconductor controlled rectifier 4 to conduct. The trigger is activated when the PNP transistor 18 (parasitic in the PMOS device 5) conducts, further triggering the semiconductor controlled rectifier 4 to cause a snapback, conducting the current path between the nodes 1 and 2, releasing the ESD stress at the node 1, and clamping the voltage between the nodes 1 and 2 to the holding voltage of the semiconductor controlled rectifier 4.

Second Embodiment

Figure 3:
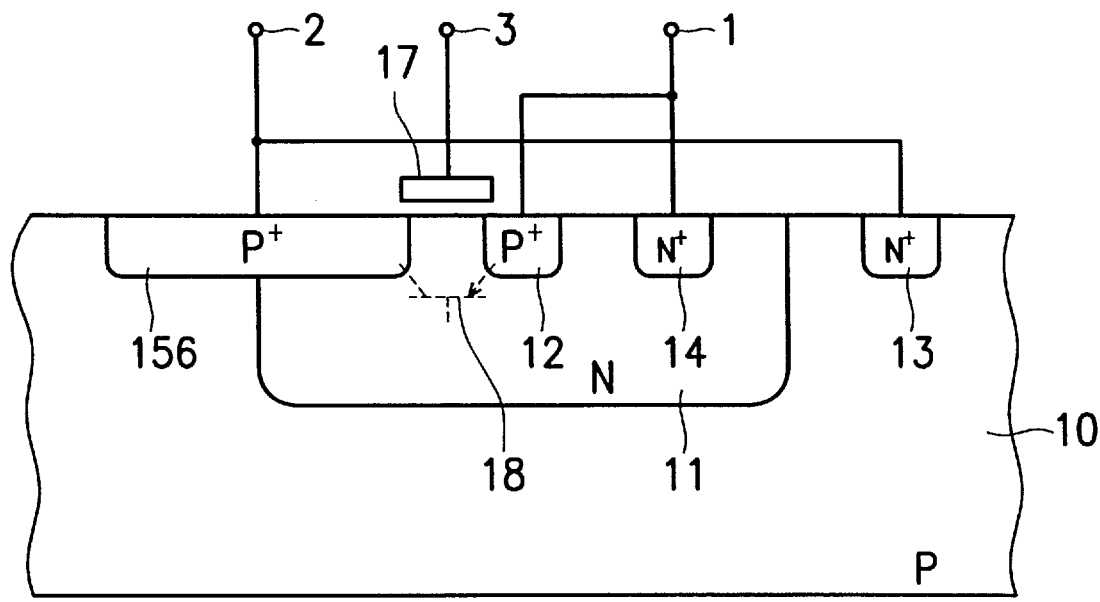
FIG. 3 is a cross section of a second preferred embodiment of the ESD protection circuit according to the invention.

Refer to FIG. 3, which shows a cross section of a second preferred embodiment of the ESD protection circuit according to the invention. In this example, the P$^+$-type doped regions 15 and 16 of the first embodiment are integrated to be a single common region 156. The P$^+$-type common region 156 overlies the junction between the N-type well region 11 and the P-type base 10.

Third Embodiment

Figure 4:
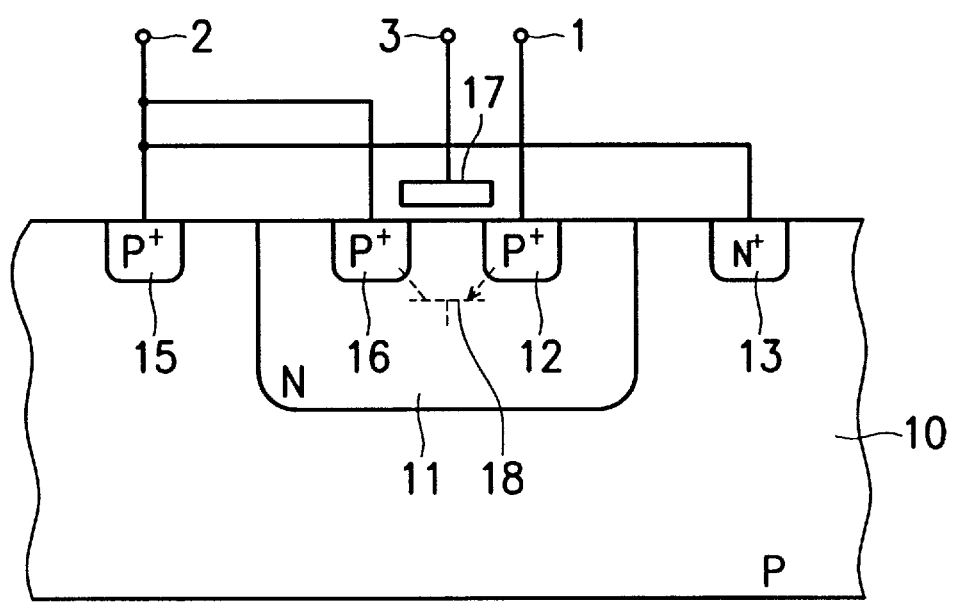
FIG. 4 is a cross section of a third preferred embodiment of the ESD protection circuit according to the invention.

Refer to FIG. 4, which shows a cross section of a third preferred embodiment of the ESD protection circuit according to the invention, wherein the reference number 10 represents a P-type semiconductor base. An N-type well region 11 is located in the predetermined location in the P-type semiconductor base 10. A P$^+$-type doped region 12 is located in the N-type well region 11, and an N$^+$-type doped region 13 is located in the P-type semiconductor base 10.

Further, the N-type well region 11 without the ohmic contact region is in a floating state. The P$^+$-type doped region 15 located in the P-type semiconductor base 10 is the ohmic contact region of the P-type semiconductor base 10. The N$^+$-type doped region 13 and the P$^+$-type doped region 15 can be on the same side of the N-type well region 11, or separately on both sides of the N-type well region 11 as shown in FIG. 1.

As shown in FIG. 4, the P$^+$-type doped region 12 is coupled to a node 1, and the N$^+$-type doped region 13 and the P$^+$-type doped region 15 are coupled to be a node 2. The nodes 1 and 2 can be respectively coupled to a junction pad (input junction pad, output junction pad, input/output junction pad) and the V$_{SS}$ power rail, respectively coupled to the V$_{DD}$ power rail and the junction pad, or respectively coupled to the V$_{DD}$ power rail and the V$_{SS}$ power rail.

Further, a P$^+$-type doped region 16 is located in the N-type well region 11 separated from the P$^+$-type doped region 12 and coupled to the node 2. Especially, the P$^+$-type doped region 16, the P$^+$-type doped region 12, and a part of the N-type well region 11 in between construct a PNP transistor 18. Further, located between the P$^+$-type doped region 16 and the P$^+$-type doped region 12, a gate 17 is coupled to a node 3 which can be coupled to the V$_{DD}$ power rail.

Figure 5:
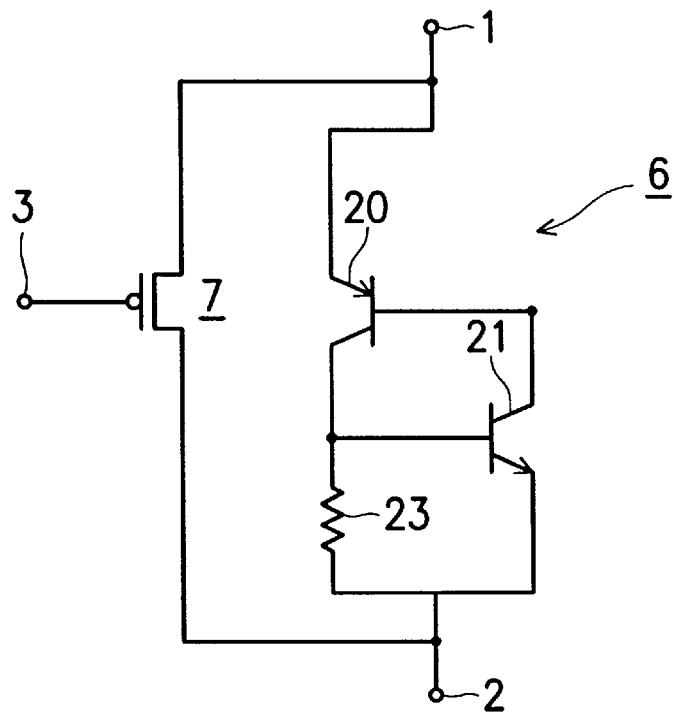
FIG. 5 is an equivalent circuit diagram of FIG. 4.

Therefore, the P$^+$-type doped region 12, the N-type well region 11, and the P-type semiconductor base 10 may respectively construct the emitter, the base and the collector of a PNP bipolar junction transistor 20. The N-type well region 11, the P-type semiconductor base 10, the N$^+$-type doped region 13 may respectively construct the collector, the base, and the emitter of an NPN bipolar junction transistor 21. In other words, the P$^+$-type doped region 12, the N-type well region 11, the P-type semiconductor base 10, and the N$^+$-type doped region 13 construct a semiconductor controlled rectifier 6; the P$^+$-type doped region 12 and the N$^+$-type doped region 13 are respectively the anode and the cathode of the semiconductor controlled rectifier 6. FIG. 5 is an equivalent circuit diagram of FIG. 4, wherein the resistor 23 represents the spreading resistance of the P-type semiconductor base 10.

Further, the PMOS device 7 shown in FIG. 5 is constructed by the gate 17, the P$^+$-type doped region 16 and the P$^+$-type doped region 12, so the P$^+$-type doped regions 16 and 12 are the source/drain pair of the PMOS device 5. In other words, the P$^+$-type doped region 12 is a common region of the semiconductor controlled rectifier 6 and the PMOS device 7.

When ESD stress occurs at the node 1, PMOS device 7 will have a breakdown and further trigger the semiconductor controlled rectifier 4 to conduct. The trigger is activated when the PNP transistor 18 (parasitic in the PMOS device 5) conducts, triggering the semiconductor controlled rectifier 6 to cause a snapback, conducting the current path between the nodes 1 and 2, releasing the ESD stress at the node 1, and clamping the voltage between the nodes 1 and 2 to the holding voltage of the semiconductor controlled rectifier 6.

Since there is no ohmic contact region between the N-type well region 11 and the node 1, the N-type region 11 is in a floating state. Therefore, the holding voltage of the semiconductor controlled rectifier 6 is lower than that of the semiconductor controlled rectifier 4 of FIG. 1.

Fourth Embodiment

Figure 6:
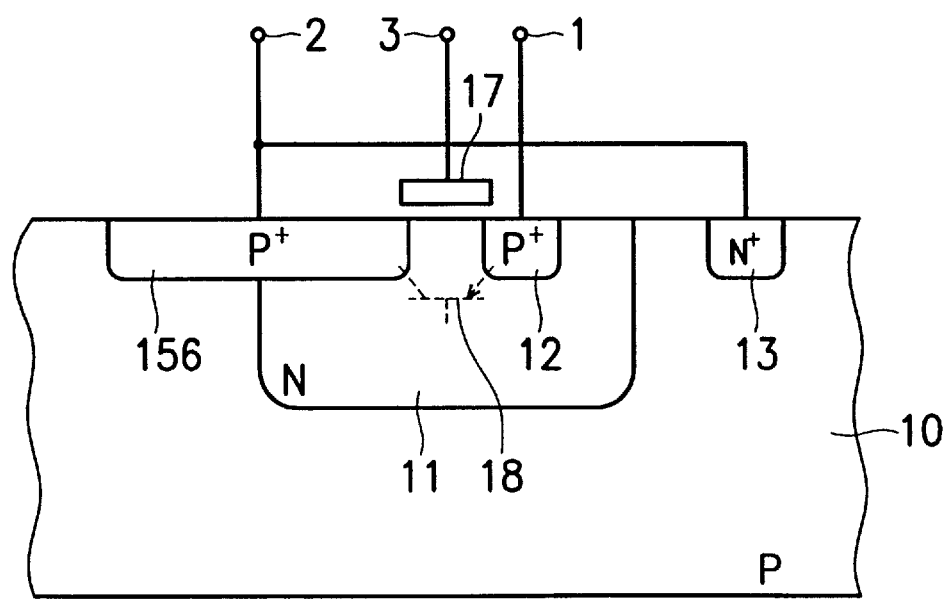
FIG. 6 is a cross section of a fourth preferred embodiment of the ESD protection circuit according to the invention.

Refer to FIG. 6, which according to the invention shows a cross section of a fourth preferred embodiment of the ESD protection circuit. In this example, the P+-type doped regions 15 and 16 of the third embodiment are integrated to be a single common region 156 which overlies the junction between the N-type well region 11 and the P-type base 10.

To sum up the above-mentioned, the ESD protection circuit according to the invention uses a PMOS device to trigger the semiconductor controlled rectifier through PNP bipolar action, so the ESD circuit has the advantages of ESD protection and compatibility with the self-aligned mental salicide diffusion production process.

While the invention has been described with reference to various illustrative embodiments, the description is not intended to be construed in a limiting sense. Various modifications of the illustrative embodiments, as well as other embodiments of the invention, will be apparent to those persons skilled in the art upon reference to this description. It is therefore contemplated that the appended claims will cover any such modifications or embodiments as may fall within the scope of the invention defined by the following claims and their equivalents.

What is claimed is:

1. An electrostatic discharge protection circuit, comprising:
    a semiconductor controlled rectifier coupled between two nodes, having an N-type semiconductor layer, wherein the N-type semiconductor layer is in a floating state; and
    a PMOS device integrated with the semiconductor-controlled rectifier to share a first P-type doped region, and having a PNP device located in said N-type semiconductor layer; wherein the PMOS device conducts the semiconductor controlled rectifier to trigger when one of the nodes is coupled to the electrostatic discharge power.

2. The electrostatic discharge protection circuit as claimed in claim 1, wherein the first P-type doped region is the anode of the semiconductor-controlled rectifier.

3. The electrostatic discharge protection circuit as claimed in claim 2, wherein the first P-type doped region is a source/drain of the PMOS device.

4. The electrostatic discharge protection circuit as claimed in claim 3, further comprising a second P-type doped region which is located separated from the first P-type doped region in the N-type semiconductor layer to be the other source/drain of the PMOS device.

5. The electrostatic discharge protection circuit as claimed in claim 4, wherein the semiconductor-controlled rectifier has a cathode integrated with the second P-type region to be a single region.

6. The electrostatic discharge protection circuit as claimed in claim 1, wherein the N-type semiconductor layer has an N-type contact region.

7. An electrostatic discharge protection circuit located on a P-type semiconductor base, comprising:
    an N-type semiconductor layer located in said P semiconductor base;
    an anode doped region located in said N-type semiconductor layer, which is coupled to a first node;
    a cathode doped region located in said P semiconductor base, which is coupled to a second node;
    a P-type contact region located in said P semiconductor base; and
    a P-type doped area separated from said anode doped region, the P-type doped area being located in said N-type semiconductor layer and coupled to said second node with said P-type contact region; wherein said anode region, said P-type doped region, and said N-type semiconductor layer construct a PNP device.

8. The electrostatic discharge protection circuit as claimed in claim 7, further comprising a gate located on said N-type semiconductor layer between said anode doped region and said P-type doped region.

9. The electrostatic discharge protection circuit as claimed in claim 7, further comprising an N-type doped region located in said N-type semiconductor layer.

10. The electrostatic discharge protection circuit as claimed in claim 7, wherein said N-type semiconductor layer is in a floating state.

11. The electrostatic discharge protection circuit as claimed in claim 7, wherein said P-type contact region and said P-type doped region are integrated to be a single region.

12. The electrostatic discharge protection circuit according to claim 1, wherein when ESD stress occurs at a node, the PMOS device will breakdown and further trigger the semiconductor controlled rectifier to conduct to release the ESD stress.

13. The electrostatic discharge protection circuit according to claim 12, wherein the semiconductor controlled rectifier is triggered by the PNP device to cause a snapback of the semiconductor controlled rectifier, conduct a current path between the nodes, release the ESD stress at the nodes, and clamp the voltage between the nodes to the holding voltage of the semiconductor controlled rectifier.

* * * * *